US010180464B2

(12) United States Patent
Saint-Marcoux et al.

(10) Patent No.: US 10,180,464 B2
(45) Date of Patent: Jan. 15, 2019

(54) ESTIMATION OF THE STATE OF DETERIORATION OF AN ELECTRIC BATTERY

(71) Applicant: RENAULT s.a.s, Boulogne-Billancourt (FR)

(72) Inventors: Antoine Saint-Marcoux, Palaiseau (FR); Masato Origuchi, Rambouillet (FR); Bruno Delobel, Issy-les-Moulineaux (FR); Thomas Creach, Paris (FR); Juan-Pablo Soulier, Paris (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 212 days.

(21) Appl. No.: 14/908,380

(22) PCT Filed: Jul. 16, 2014

(86) PCT No.: PCT/FR2014/051826
§ 371 (c)(1),
(2) Date: Mar. 15, 2016

(87) PCT Pub. No.: WO2015/015083
PCT Pub. Date: Feb. 5, 2015

(65) Prior Publication Data
US 2016/0187432 A1 Jun. 30, 2016

(30) Foreign Application Priority Data

Jul. 29, 2013 (FR) .................................... 13 57472

(51) Int. Cl.
*G01R 31/36* (2006.01)
*B60L 3/00* (2006.01)
(Continued)

(52) U.S. Cl.
CPC ........ *G01R 31/3679* (2013.01); *B60L 3/0046* (2013.01); *B60L 11/1861* (2013.01);
(Continued)

(58) Field of Classification Search
CPC ............ G01R 31/3679; G01R 31/3651; G01R 31/3624; G01R 31/3662; B60L 11/1861; B60L 3/0046; H01M 10/48; H01M 10/44
See application file for complete search history.

(56) References Cited

U.S. PATENT DOCUMENTS 5,365,453 A * 11/1994 Startup .............. G01R 31/3648
320/136
6,160,380 A * 12/2000 Tsuji ................... B60L 11/1851
320/132
(Continued)

FOREIGN PATENT DOCUMENTS

FR    2 971 855 A1    8/2012
WO    2012/091076 A1    7/2012
WO    2012/148019 A1    11/2012

OTHER PUBLICATIONS

International Search Report dated Sep. 8, 2014 for PCT/FR2014/051826 filed on Jul. 16, 2014.
(Continued)

*Primary Examiner* — Khamdan N. Alrobaie
(74) *Attorney, Agent, or Firm* — Oblon, McClelland, Maier & Neustadt, L.L.P.

(57) ABSTRACT

A method for managing an electrochemical accumulator or a storage battery includes determining an estimated value of a state of deterioration of the accumulator from the accumulator's history of voltage values, intensity of current flow, and temperature. The estimated value is a barycentric value of the state of deterioration calculated as a barycenter of at least two values. The at least two values include a first value indicative of the state of deterioration of the accumulator
(Continued)

calculated by a first method and a second value indicative of the state of deterioration of the accumulator calculated by a second method different from the first method. From an initial commissioning state of the accumulator, barycentric coefficients are varied at least once to calculate the next barycentric value when a previous value of the state of deterioration of the accumulator, calculated according to the first method, has passed a first threshold.

8 Claims, 1 Drawing Sheet

(51) Int. Cl.
  *B60L 11/18* (2006.01)
  *H01M 10/44* (2006.01)
  *H01M 10/48* (2006.01)
(52) U.S. Cl.
  CPC ...... *G01R 31/3651* (2013.01); *G01R 31/3624* (2013.01); *G01R 31/3662* (2013.01); *H01M 10/44* (2013.01); *H01M 10/48* (2013.01)

(56) References Cited

U.S. PATENT DOCUMENTS

| | | | |
|---|---|---|---|
| 7,202,632 B2* | 4/2007 | Namba | G01R 31/3651 320/132 |
| 2013/0278221 A1 | 10/2013 | Maeda | |
| 2014/0052396 A1 | 2/2014 | Jin et al. | |
| 2015/0369876 A1* | 12/2015 | Kobayashi | H01M 10/482 29/593 |
| 2016/0231389 A1* | 8/2016 | Wakasugi | H01M 10/48 |

OTHER PUBLICATIONS

French Search Report dated Apr. 28, 2014 for FR 1357472 filed on Jul. 29, 2013.

* cited by examiner

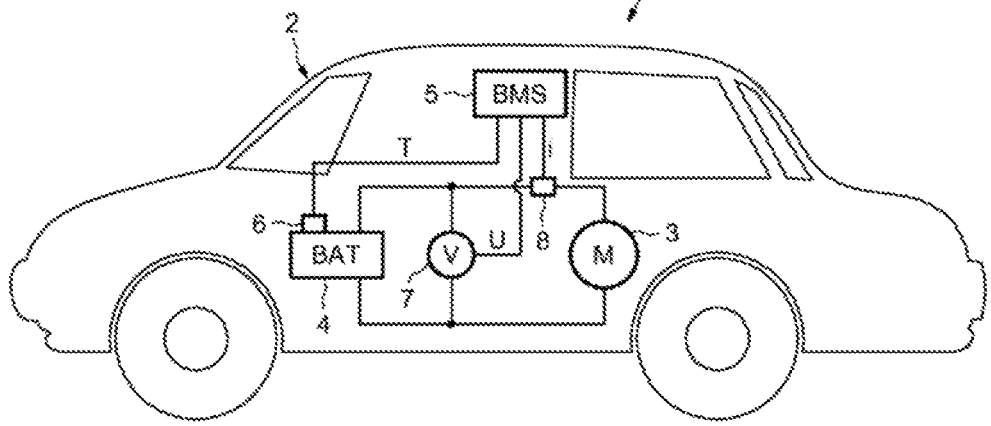
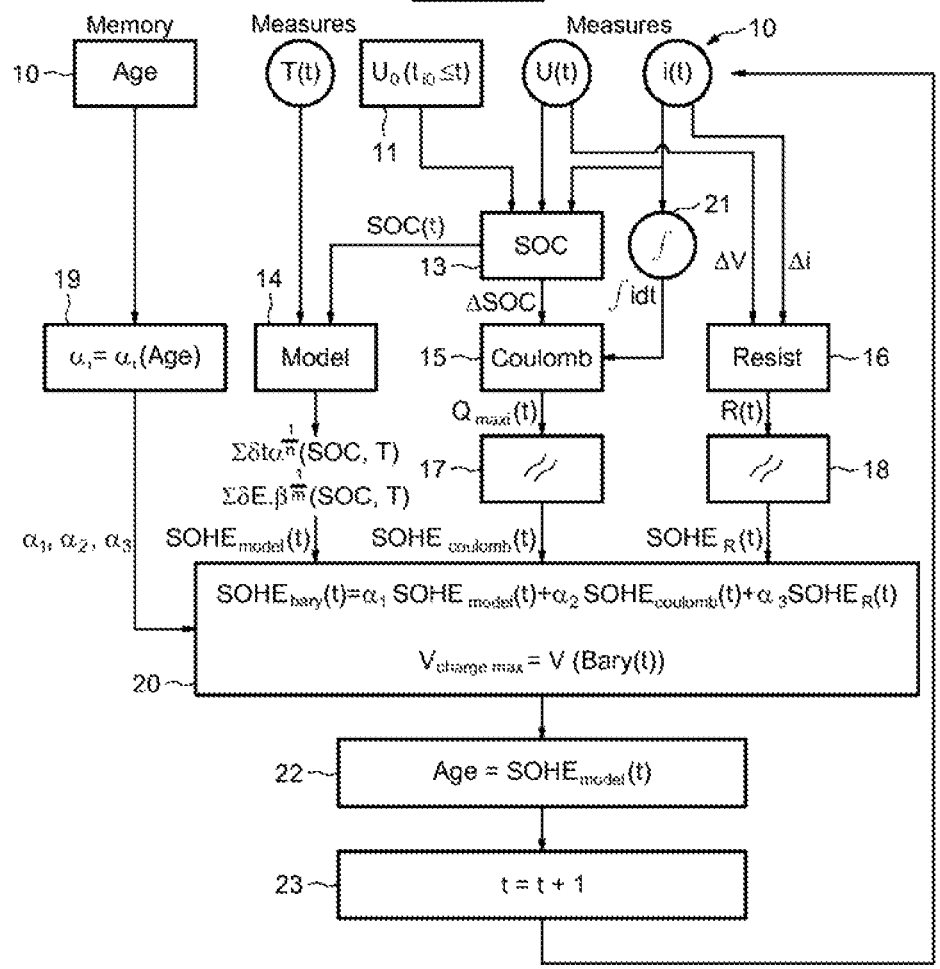

ESTIMATION OF THE STATE OF DETERIORATION OF AN ELECTRIC BATTERY

The invention relates to the management of the charging of an electric storage battery, in particular the management of the charging of a battery for an electric and/or hybrid motor vehicle. Such batteries can be of the lithium-ion type, for example. They generally comprise a plurality of electric accumulators, also referred to as cells. Each cell has an electrochemical system capable of being recharged up to a maximum no-load voltage, and then delivering an electrical current at a voltage which is initially slightly less than the maximum no-load voltage, which then decreases, at constant current intensity, until the next step of recharging of the battery. The batteries are generally controlled by an electronic battery control system (BMS—"battery management system") that controls for example the battery recharge phases in order to bring the battery to the desired voltage at the end of recharging without causing overheating of the battery and preventing any of the cells from reaching a significantly higher or significantly lower level of charge compared with the other battery cells.

The BMS system can be configured to calculate a dimensionless variable "SOC" (state of charge) making it possible to quantify, by means of a variable between zero and 1, the level of charge of the battery by methods known per se, for example involving an integral of current intensity values having passed through the battery, a variation of the voltage level of the battery, and a no-load voltage of the battery measured at a time when the current passing through the battery was zero.

A BMS system assures that the battery is protected by preventing it from operating outside its typical operating range, and assures protection in particular against overcurrent, overvoltage (when charging), undervoltage (when discharging) or even, against overheating and under-temperature, this being particularly important for Li-ion batteries.

The BMS system makes it possible in particular to manage the charging of the battery by fixing, during recharging phases, the maximum level of power authorized during charging. Said system makes it possible to display characteristic values of the state of the battery, such as the SOC. The BMS system can also be configured to estimate, whilst the vehicle is running, an SOHE (state of health energy) value, which is a coefficient making it possible to quantify the level of energy available in the battery once charged to its full potential, taking into account the degradation of battery performances during the life cycle of said battery. An SOHE value can for example be calculated as the ratio of:

The energy that can be drawn from the battery starting from its fully charged state, its current state of wear, a reference temperature (for example 25° C.), and a constant current reference level (for example 33A for a cell of 33 Ah), until the voltage across the battery drops to a low voltage threshold (for example 2.5V).

The energy that can be drawn from the battery starting from its fully charged state, when new, at the same reference temperature, and the same constant current reference level, until the voltage across the battery drops to the low voltage threshold.

The low voltage threshold can correspond to the minimum voltage across the battery below which it is forbidden to draw from the battery so as not to degrade the battery (known as the "cut-off" voltage).

The SOHE value can be calculated by various methods mentioned below, and makes it possible to estimate the energy available in the battery at the end of charging and the mileage that the driver can thus hope to cover.

To improve the accuracy of the estimation of autonomous vehicle life, it is thus beneficial to estimate the SOHE as accurately as possible; However, sources of miscalculation are diverse, and their amplitude varies as the battery increases in age and as the battery is subjected to increased cycling. Moreover, so as not to worry the vehicle driver as a result of fluctuations in the estimated autonomy, which could seem erratic from one recharging to the next, it is preferable for the evolution of the estimated value of SOHE to be constant from one recharging to the next.

Furthermore, proceeding from a reliable estimation of the SOHE of the battery, it may be possible to optimize the charge-discharge cycling of the battery so as to increase the service life of the battery compared with charge-discharge cycling that would still be performed within the same limits of no-load voltages of the battery.

There are many empirical battery deterioration models. For example, the document "R. Spotnitz, "Simulation of capacity fade in lithium ion batteries", Journal of Power Sources 113 (2003) 72-80" makes it possible to predict a theoretical battery deterioration, for a particular customer use profile. The proposed model is a model in open loop. In other words, in case of degradation of the battery not predicted by the model (abnormal degradation or poorly calibrated model), the estimation of the SOHE may be wrong: the SOHE follows the evolution of the theoretical battery used to calibrate the model, but is not readjusted based on the degradation of the actual battery.

The document "METHOD AND APPARATUS OF ESTIMATING STATE OF HEALTH OF BATTERY" (US2007/0001679 A1) discloses that there is a link between the internal resistance of a battery cell and its state of deterioration (SOH or "state of health"). It proposes comparing the estimated internal resistance of a cell to mapped reference resistance values. A disadvantage of this method is that the estimation of the SOHE also depends on the actual usage profile (current, temperature) of the battery.

U.S. Pat. No. 6,653,817 (General Motors) also discloses a method for estimating the state of deterioration of the battery from the characterization of its internal resistance. The method described in the document requires a system architecture with specific high-power electronic components. Moreover, the method uses a calculation intermediary, the SOHP ("state of health power"), and poor characterization of the SOHP-SOHE link can lead to a significant error in the estimation of the SOHE.

Lastly, there are methods for estimating the state of deterioration of a battery by what is known as "coulomb counting", for example as described in "Enhanced coulomb counting method for estimating state-of-charge and state-of-health of lithium-ion batteries" (Applied Energy, Volume 86, Issue 9, September 2009, pages 1506-1511). A disadvantage of this method is that it lacks precision since the battery is only partially discharged between two recharges, for example when the profile of roads traveled or the frequency of recharging via mains power lead the SOC to vary between 100% and 50% without ever going lower.

The invention aims to provide an estimation of the state of deterioration of a battery installed in an electric or hybrid vehicle that is accurate over the entire service life of the battery and is not dependent on the driver's driving habits. The invention also seeks to optimize the management of the recharging phases of the battery based on the calculated state of deterioration, so as to prolong the service life of the battery.

To this end, the invention proposes a method for managing an electrochemical accumulator or a storage battery, wherein an estimated value of a state of deterioration of the accumulator is determined from the history of the voltage values across the accumulator, the history of the intensity of current flowing through the accumulator, and the history of the temperature across the accumulator. The estimated value is a barycentric value of the state of deterioration calculated as a barycenter of at least two values indicative of the state of deterioration of the accumulator, that is to say a first value indicative of the state of deterioration of the accumulator calculated by a first method and a second value indicative of the state of deterioration of the accumulator calculated by a second method different from the first method. From an initial commissioning state of the accumulator, the barycentric coefficients are varied at least once, making it possible to calculate the next barycentric value of the state of deterioration of the accumulator, when a previous SOHE value of the accumulator, calculated according to the first method, has passed a first threshold.

Advantageously, the first indicative value is calculated from a first sum of first temperature and state of charge coefficients characterizing successive states of the accumulator, the first coefficients each being multiplied by the time spent in each state, and from a second sum of second temperature and state of charge coefficients characterizing successive states of the accumulator, the second coefficients each being multiplied by the energy discharged by the battery in this state. Advantageously, the first indicative value is calculated taking into account the sum of a first power of the first sum and a second power of the second sum. The first indicative value can for example be calculated as the ones' complement of the sum of a first power of the first sum and of a second power of the second sum.

In accordance with a preferred embodiment, the second calculation method is a calculation method providing intermediate calculation terms akin to an internal resistance of the accumulator and/or akin to a calculation of total charging capacity of the battery.

More generally, the first calculation method may be an open loop calculation method, and the second calculation method may be a closed loop calculation method. It is considered here that a calculation method is an open loop method if it proceeds by summing the values calculated based on values successively recorded at the battery over time regardless of the amplitude (SOC variations or voltage variations) of the current cycling. An open loop method does not make it possible to detect if the battery is deteriorating prematurely abnormally quickly. Here, it is considered that a calculation method is a closed loop method if it comprises intermediate calculation values representing known physical values in order to reflect the actual development of the state of deterioration of the battery, such as the internal resistance of the battery, the apparent internal resistance of the battery, or the total charging capacity of the battery. A method can be considered to be closed loop in particular if it provides for calculating intermediate values from values acquired during a cycling amplitude of the battery greater than a cycling threshold, and/or if the method is used to calculate intermediate values by a digital filter responsive to behavioral deviations of the battery compared with a theoretical behavioral deviation equation (for example calculations of SOC and of total battery capacity by Kalman filter type methods). The closed loop calculation methods make it possible to detect a difference in behavior between two batteries of identical advertised theoretical behavior, but demonstrating different actual performances, even if these batteries are subjected to the same cycling over time. It is an adaptive approach.

In accordance with a variant embodiment it is possible to calculate the barycentric value as a barycenter of more than two values indicative of the state of deterioration of the battery, such as a barycenter of three values indicative of the state of deterioration of the battery calculated by different methods. The first indicative value can be calculated by a method commonly referred to as an "empirical model", involving sums of terms based on temperatures and states of charge characterizing successive states of the accumulator. The second value indicative of the state of deterioration and/or the third value indicative of the state of deterioration can be calculated, respectively, by a method known as coulomb counting, involving a calculation of the development of the total charging capacity of the accumulator over time, and by a method known as the impedance or internal resistance method, involving a calculation of the development of an impedance or of an internal resistance of the accumulator over time.

Preferably, the weighting coefficient associated with the value calculated by the first method is strictly greater than 0.5 at the time of commissioning of the battery and then decreases, and the weighting coefficient associated with the value calculated by the second method is strictly less than 0.5 and then increases over time.

The barycentric coefficient associated with the first value indicative of the state of deterioration may remain constant until the barycentric value passes a first threshold, then may vary substantially linearly on the basis of the barycentric value until the barycentric value passes a second threshold.

Advantageously, the barycentric value may be closer to or even equal to the first value indicative of the state of deterioration until a first threshold is passed by the barycentric value. Then the barycentric value can gradually become closer to a second value indicative of the state of deterioration, until it equals this second indicative value while it reaches a second threshold. It is possible that, when the barycentric value passes a third threshold, it may, as a result of the effect of barycentric coefficients, begin to approach a third value indicative of the state of deterioration until it reaches said third value at the moment at which it reaches a fourth threshold.

In a preferred embodiment, the second value indicative of the state of deterioration is calculated by a method of the coulomb counting type, and the third value indicative of the state of deterioration is calculated by a method involving a calculation of the development of an impedance or of an internal resistance of the accumulator.

In accordance with an application of the invention to an accumulator installed onboard a vehicle, during steps of recharging of the accumulator, an end-of-charging voltage is fixed that is calculated on the basis of the barycentric value, this end-of-charging voltage being gradually increased during the use of the accumulator onboard a vehicle.

In accordance with an advantageous embodiment, between the commissioning of the accumulator and a fifth threshold value of the barycentric value, the end-of-charging voltage is fixed so as to vary linearly with respect to the barycentric value, and is then held substantially constant during the subsequent use of the accumulator onboard the vehicle.

In accordance with one variant embodiment, the end-of-charging voltage is an increasing function or a decreasing function of the barycentric value, this end-of-charging voltage varying more quickly compared to the barycentric value at the time of commissioning of the accumulator than at the end of the service life of the accumulator. At the end of the service life of the accumulator, the end-of-charging voltage curve may have a plateau or may converge towards a plateau.

In accordance with another aspect, the invention proposes an electric power supply system comprising at least one electrochemical accumulator, a temperature sensor associated with the accumulator, a voltage sensor, and a current intensity sensor making it possible to estimate the voltage across the accumulator and the intensity of current passing through the accumulator, a computer configured to estimate a level of charge of the accumulator over time, in particular by using the voltage and intensity values. The system comprises an electronic control unit configured to calculate a barycentric value of a state of deterioration of the accumulator, such as a barycenter of at least one first and one second value characterizing a state of deterioration of the accumulator and calculated by two different methods.

The barycentric coefficients used to calculate the barycentric value at a given time are dependent on the value assumed by the first value characterizing the state of deterioration during assessment thereof at a previous time.

The electric power supply system comprises an accumulator management unit configured to increase, during the life cycle of the accumulator, the end-of-charging voltage defining the maximum no-load voltage to which a recharging system is authorized to bring the accumulator. The end-of-charging voltage is fixed on the basis of the calculated barycentric value.

Further objectives, features and advantages of the invention will become clear upon reading the following description given solely by way of non-limiting example, and with reference to the accompanying drawings, in which:

FIG. 1 is a schematic view of a motor vehicle equipped with a battery and a battery management system according to the invention, FIG. 2 is a simplified algorithm for calculating a state of deterioration of a battery by the battery management system according to the invention.

As illustrated in FIG. 1, a motor vehicle 1, for example a motor vehicle of the electric type or hybrid type, is equipped with a motor 3 capable of driving the wheels of the vehicle and with an electric power supply system 2 capable of supplying the motor 3. The electric power supply system 2 includes, in particular, an electric storage battery 4, an electronic control unit 5 configured to manage the battery 4 and designated by the BMS acronym as "battery management system". The battery 4 is equipped with a temperature sensor 6 capable of measuring a temperature T characteristic of the battery that is transmitted to the BMS 5. The battery is also equipped with a voltmeter 7 making it possible to know the voltage U across the battery 4 and transmitting this value U to the BMS 5. An ammeter 8 is lastly connected to the battery 4 so as to measure the intensity of current passing through the battery 4. The value i corresponding to the current intensity is also transmitted to the BMS 5.

The BMS makes it possible in particular to monitor the voltage across the battery and the current intensity passing through the battery makes it possible to estimate a state of charge of the battery, and, in particular in accordance with the state of charge of the battery and parameters such as the temperature of the battery or temperatures of electrochemical cells forming the battery, makes it possible for example to prohibit the application of a voltage above a threshold to the battery terminals and/or the flow of a current above a threshold through the battery.

The BMS system can also prohibit the drawing of energy from the battery when the state of charge thereof falls below a certain threshold, and can fix the voltage applied to the terminals of the battery during the recharging thereof via mains power for example, so as to bring the battery to an end-of-charging voltage.

The BMS system 5 can be configured to calculate values such as a level of charge (SOC: state of charge) of the battery 4, an SOHE value characterizing a state of deterioration of the battery, and a maximum charge capacity $Q_{max}$ of the battery, corresponding substantially to the maximum energy the battery can store at its current measured level. The BMS can use these values to adjust the operational limits within which it authorizes the operation of the battery (the minimum voltage across the battery before prohibiting the drawing of energy from the battery, maximum voltage across the battery at the end of recharging of the battery, maximum instantaneous power authorized to be drawn from the battery, etc.).

FIG. 2 illustrates in particular a calculation process implemented by the BMS 5 in FIG. 1 to estimate a value $SOHE_{bary}$ representative of the state of deterioration of the battery, taking into account the wear of the battery 4. For the reasons described below, the calculation of this value $SOHE_{bary}$ is implemented by performing a weighted average or a barycentric average of three estimations of the state of deterioration $SOHE_{model}$, $SOHE_{coulomb}$, and $SOHE_R$ estimated by three independent methods. At the time of calculation t the sensors 6, 7 and 8 of FIG. 1 determine a temperature T of the battery 4, a voltage U across the battery 4 and a current intensity i flowing through the battery 4. These values are summarized in box 10 representing the measurements performed at the time t. At this same time t, there are available in memory boxes a first value "age" in a memory box 12 and a value $U_0$ in a memory box 11. The value "age" comes from a state of deterioration calculation performed previously (calculated from the model $SOHE_{model}$), the value $U_0$ is a no-load voltage value of the battery 4 recorded at the time $t_{t0}$ before the time t, during which the battery neither received nor delivered current. In accordance with variant embodiments, the value $U_0$ can be reassessed by various methods depending on other measurements T, U, i performed at periodic intervals. The BMS 5 includes a SOC computer 13, which, in accordance with known methods, estimates a value SOC(t) corresponding to a state of charge of the battery 4 at the time t. Typically, this SOC value can be calculated depending on the history of the voltage U, the history of the current intensity i, and, in accordance with the used methods, depending on the last available no-load voltage values $U_0$.

The BMS 5 includes an estimator of the state of deterioration of the empirical type 14, which uses the state of charge values SOC calculated by the computer 13 and the temperatures T measured by the sensor 6. The estimator 14 generally delivers a value $SOHE_{model}$ of T that involves linear combinations of coefficients tabulated based on an SOC, T state pair, certain coefficients being associated with a resting state of the battery and then weighted by a residence time of the battery in this condition, and other coefficients being weighted by the energy variations experienced by the battery when it was in the state corresponding to the pair SOC, T.

The BMS 5 also includes an internal resistance estimator 16, which performs an estimation of an apparent internal resistance of the battery 4 and then infers from this, with the aid of a map 18, a value $SOHE_R$ of the state of deterioration of the battery 4.

The estimation of the internal resistance R of the battery 4 can in particular be carried out by measuring, during a charging/discharging phase of the battery, a variation of delivered current $\Delta_i$ combined with a variation of delivered voltage $\Delta U$.

The estimator 15 of the state of deterioration of the battery 4 by coulomb counting performs an estimation of the charging capacity $Q_{max}$ of the battery at the time t. The estimator 15 may use for this purpose a difference $\Delta SOC$ of the state of charge of the battery, which is transmitted to said estimator by the SOC computer 13. The choice of the initial moment from which the SOC difference is calculated until the time t and the storing of the value of SOC corresponding to this initial state can be made either at the estimator 13 or at the estimator 15.

The coulomb estimator 15 also receives information concerning the intensities of current i(t) recorded over time, for example the integrator 21 receives an integral value of the intensities of current i(t) measured over time until the time t. From these values, the coulomb estimator calculates the maximum charge capacity $Q_{max}$ of t and, possibly after dividing this maximum charge by an initial value of maximum charge when the battery is new, uses this value to read in a map 17 a state of deterioration value $SOHE_{coulomb}$. In parallel to the calculation of the state of deterioration values $SOHE_{model}$, $SOHE_{coulomb}$, $SOHE_R$, the BMS 5 selects three barycentric coefficients $\alpha_1$, $\alpha_2$, $\alpha_3$ using a selector 19. The values $\alpha_1$, $\alpha_2$, $\alpha_3$ can be based on the "age" value stored in the memory 12, or can be read in maps that are based on this "age" value. The BMS 5 calculates a barycentric state of deterioration value of the battery 4 by weighting the three values $SOHE_{model}$, $SOHE_{coulomb}$ and $SOHE_R$ by the three barycentric coefficients $\alpha_1$, $\alpha_2$, $\alpha_3$ in a weighting step 20.

Once this barycentric state of deterioration has been estimated, the BMS 5 can use the value thus found to determine for example a maximum voltage $V_{charge\_max}$ at the end of recharging of the battery. The BMS can use this value $V_{charge\_max}$ to limit the maximum recharging voltage during the next step of recharging of the battery, if a new maximum charge value is not calculated in the meantime. The BMS can also use the value $SOHE_{bary}$ to calculate precisely the amount of energy available in the battery at the end of the recharging, and to deduce therefrom the mileage autonomy that is displayed to the driver of the vehicle. The last value $SOHE_{bary}$ can also be used when calculating the SOC until a new value of $SOHE_{bary}$ is available.

In a step 22, the "age" value used to determine the barycentric coefficient $\alpha_1$, $\alpha_2$, $\alpha_3$, is updated by recording in the memory 12 the new value $SOHE_{model}$ (t) calculated. The counter of time t is then incremented in a step 23, and a new series of measurements T(t), (U (t), i(t) are performed, using temperature, voltage, and current intensity sensors.

The invention proposes to calculate the state of deterioration, SOHE, of the battery by combining several calculation methods. Typically, the value characterizing the state of deterioration is equal to 1 (or equal to 100%) when the battery is new, and then decreases. The value SOHE calculated in accordance with the invention is a barycenter of several estimations obtained independently from one another by several methods. The greatest weight is given to the method for which it is thought that the error will be lower a priori at a given stage of the service life of the battery. To do this, the weight assigned to the various methods is calculated on the basis of the latest assessment of the state of deterioration of the battery carried out. For example, when the value $SOHE_{model}$ falls below a first threshold, the weights of different methods start to be varied linearly on the basis of the $SOHE_{model}$. The BMS 5 brings for example the coefficient associated with a method used in early life of the battery from 1 to zero, and simultaneously brings from zero to 1 the coefficient of a method that becomes preferred in the second half of the service life of the battery. It is possible to apply the approach again when the $SOHE_{model}$ falls below a second threshold, so as to favor a third method of calculating the SOHE at the end of the battery life. In accordance with another variant embodiment, a first calculation method can be applied in early life of the battery, then the barycentric coefficients can be developed in order to calculate, at the middle and/or end of life, a value that is a weighted average—with constant coefficients—between the results of two other calculation methods. Other combinations are possible, and the barycentric coefficients do not necessarily pass through the values zero or 1.

An outline of a calculation of three basic preferred methods for estimating the SOHE will now be provided. A BMS according to the invention is preferably configured so as to use a barycentric combination of at least two of these basic methods. The barycenter is calculated preferably by putting more weight on an "empirical" method type when the battery is new, and subsequently increasing the weight of at least one second method, either of the "coulomb counting" type or of the type estimating the "internal resistance" of the battery.

The value of SOHE can be calculated either globally for an entire battery or, in particular, if there are provided voltage sensors for each cell and a temperature estimator making it possible to evaluate a temperature of each battery cell, by first calculating an SOHE for each cell and then taking, as SOHE value of the battery at a given instant, the minimum SOHE value calculated for all the cells at that moment.

Estimation of the State of Deterioration of a Battery Cell on the Basis of the Internal Resistance.

The BMS calculates the SOHE from the calculation of the apparent resistance of the cell over a large current intensity variation (charging or discharging). The general principle is as follows: the change in current during a given period of time is compared with the variation of the voltage at the cell terminals. The ratio of the voltage variation to the variation of current intensity then corresponds to the "apparent resistance" of the cell. If this apparent resistance is determined over a specific frequency range, reference is made to cell impedance. At least two implementation techniques are possible.

This apparent resistance $RESISTANCE_{apparent}^{cell}$ is compared to the value of the internal resistance $RESISTANCE_{NEW}^{cell}$, that this cell would have had in the new state under the same conditions of charging or discharging. A parameter called SOHP for example is then calculated, this being a ratio characterizing the increase of the internal resistance of the cell.

$$SOHP = \frac{RESISTANCE_{NEW}^{cell}}{RESISTANCE_{apparent}^{cell}} \quad \text{(equation 1)}$$

Lastly, a prerecorded map makes it possible to read a value $SOHE_R$ on the basis of the value SOHP thus estimated.

This approach has the advantage of being simple to implement.

The "apparent" resistance calculated over the cell is a value that can also be useful for calculating the maximum authorized current intensity, so as not to stress the cell beyond its maximum authorized power (when discharging, when charging via mains power, and in the event of regenerative braking).

The value $RESISTANCE_{NEW}^{cell}$ can be criticized as being the resistance of a new cell measured under specific, clearly identified conditions (for example normalized peak current), but which are not actually those in which the apparent resistance is measured (since the current profile is controlled by the driver). The calculated SOHP thus differs from the SOHP used to establish the map.

In addition, some cells may have an apparent internal resistance that decreases in early life (which may seem surprising). The link between SOHP and SOHE then is not bijective, especially in early life. This makes the estimation of the deterioration of the battery on the basis of the estimation of the internal resistance of the battery very uncertain, especially in early life.

An estimation method based on the internal resistance of the cell is all the more accurate the greater are the variations of current intensity through the battery. The ability of the BMS to provide an accurate estimation of the SOC will therefore depend on the use profile of the driver of the vehicle.

It is possible to calculate the impedance of a cell by an excitation over a specific frequency band.

The specific frequency band can optionally be limited to a single frequency. This estimation requires the application of a current (or voltage) excitation over this specific frequency band; this excitation may come from the charging system or other power electronics components of the high-voltage circuit (such as a DC/DC converter).

This latter type of cell characterization is repeatable because the current excitation in the frequency band of interest can be constructed so as to be always the same. This makes the comparison of the impedance measured at the value that a new cell would have had in the same conditions more relevant for the calculation of the SOHP.

However, this characterization requires a specific architecture and control system for the power electronics system in order to enable the system to apply over the batteries an excitation repeatable over the well-defined frequency band.

The estimation of the state of deterioration $SOHE_R$ of a battery cell on the basis of the internal resistance is considered here as a closed loop estimation in the sense that the calculated values make it possible to detect a premature deterioration of the cell if this does not behave as a reference cell used to calibrate the calculation method.

Estimating the State of Deterioration of a Battery Cell by Coulomb Counting.

The general principle is as follows: the following are compared:
- the development, during the course of a cycling, of the state of charge of the cell: $\Delta SOC = SOC_{end} - SOC_{init}$ in which $SOC_{end}$ is the state of charge at end of cycle and $SOC_{init}$ is the state of charge at start of cycle,
- the total electric charge that has been delivered by the cell during the cycle: $Q = \int i \cdot dt$ where I is the current passing through the cell.

The maximum charge $Q_{max}$ that the cell would be able to deliver if said cell was recharged at this moment to its maximum capacity is recalculated from the delivered electric charge and from the variation of SOC:

$Q_{max}$ is also referred to as "total capacity of the cell"

$$Q_{max} = \frac{\int i \cdot dt}{\Delta SOC}$$

The ratio SOHQ of this maximum capacity to the maximum capacity of the cell when new, that is to say $$SOHQ = \frac{Q_{max}}{Q_{max}^{NewCell}},$$

makes it possible, with the aid of a map, to trace the value $SOHE_{coulomb}$, characterizing the state of deterioration of the cell.

This approach is fairly simple to implement. However, the calculation is only relevant if the SOC is calculated from the voltage across the cell. The calculation may be distorted by an error of SOC estimation (due to the polarization of cells).

The calculation can also be marred by errors by poor current measurement (in particular because of a power offset).

To get an accurate estimate of the SOHE, the values must be recorded over a cycling corresponding to a variation of SOC of high amplitude. The ability of the BMS to provide an accurate estimation of the SOC will therefore depend on the driving and battery recharging habits of the driver of the vehicle.

In this calculation method, it is necessary to re-estimate the SOC values at the beginning and end of the cycle on the basis of the "cell voltage" information. An important assumption to consider is therefore whether the curve connecting the voltage and state of charge SOC is known, and that this is dependent only secondarily on deterioration. This method can cause significant fluctuation of the state of deterioration estimated by the BMS, as this type of estimation is highly dependent on the cycling profile (current profile, cell temperature).

The estimation of the state of deterioration of a battery cell by coulomb counting is likewise considered here as a closed loop estimation. The calculated values make it possible to detect a premature deterioration of the cell if the degradation of the cell is essentially linked to the loss of active material.

Estimation of the State of Deterioration of a Battery Cell Using an Onboard Model of Deterioration.

The general principle is as follows: the cell deterioration model makes it possible to calculate the retention capacity of the cell from the time spent by said cell at each SOC level and at each temperature level. The model is an open loop model. This calculation does not make it possible to detect if the deterioration of the cell corresponds to that of the reference cell used to calibrate the model. However, this calculation method does not require any particular cycling profile of the battery.

The model proposes to estimate a value $SOHE_{model}$ of the state of deterioration of the cell in accordance with a formula of the type:

$$SOHE_{model} = 1 - \sum_{T,BSOC} \left\{ \alpha(SOC, T) \frac{1}{n} \cdot \delta t(SOC, T) \right\}^n -$$

$$\sum_{T,BSOC} \left\{ \beta(SOC, T) \frac{1}{m} \cdot \delta E(SOC, T) \right\}^m$$

$\alpha$ (SOC, T) is a mapped coefficient of calendar degradation associated with a state of charge range [SOC$-\Delta_{SOC}$, SOC$+\Delta_{SOC}$] and with a temperature range [T$-\Delta_T$, T$+\Delta_T$] provided, for example centered, respectively on a given SOC value and a given T value.

$\delta T$ is the total time spent by the cell in the state of charge range [SOC−$\Delta_{SOC}$, SOC+$\Delta_{SOC}$] and in the temperature range [T−$\Delta_T$, T+$\Delta_T$] considered.

The sum $$\sum_{T,BSOC}$$

covers all ranges [SOC−$\Delta_{SOC}$, SOC+$\Delta_{SOC}$] and [T−$\Delta_T$, T+$\Delta_T$] conceivable during operation of the cell.

$\beta$ is a mapped coefficient of degradation by cycling, associated with a given state of charge range [SOC−$\Delta_{SOC}$, SOC+$\Delta_{SOC}$] and a given temperature range [T−$\Delta_T$, T+$\Delta_T$].

$\delta E$ is the total energy in kWh discharged during cycling of the battery each time that the battery is in a given state of charge range [SOC−$\Delta_{SOC}$, SOC+$\Delta_{SOC}$] and in a given temperature range [T−$\Delta_T$, T+$\Delta_T$].

m and n are exponents, whole or not, preferably between 0.5 and 2.

In accordance with an alternative embodiment, it is possible to directly map the coefficients $$\alpha(SOC, T) \frac{1}{n} \text{ and } \beta(SOC, T) \frac{1}{m}$$

Typically, the integral $\int U \cdot i \, dt$ is calculated constantly since the last moment at which either the SOC or the temperature T passed one of the defined range limits in order to map $\alpha$ and $\beta$. When one of the limits is passed again, the value of the integral is added to a memory associated with the pair of ranges [SOC−$\Delta_{SOC}$, SOC+$\Delta_{SOC}$], [T−$\Delta_T$, T+$\Delta_T$] that were just left, and $\int U \cdot i \, dt$ is recalculated again with a view to adding it to another memory box corresponding to the new range pair corresponding to the current state of the cell.

In accordance with a particular embodiment, the parameter $\beta$ may also depend on the level of current passing through the cell.

This calculation method by empirical model avoids significant fluctuations of the estimated SOHE.

Because the model is open loop, it requires the realization of many cell deterioration characterization tests in order to be able to calibrate the model. Calibration is all the more relevant because the battery presents characteristics and developments of characteristics close to the reference cell used to calibrate the model, and a priori is most relevant in early cell life.

If the battery is subjected to a high temperature, while the BMS is switched off, the calculation of the deterioration will not take into account this phenomenon.

Choice of Weighting Coefficients

The invention makes it possible to benefit from the advantages of each of these methods at different stages of the deterioration of the battery:

In early life, the calculation of deterioration by onboard model is not only accurate, but it makes it possible to avoid large fluctuations in the state of deterioration SOHE estimated by the BMS.

At the end of life, it is beneficial to perform closed loop estimation (from the internal resistance and/or from coulomb counting) in order to detect any degradation of the battery (that the model would not have expected).

The invention therefore proposes calculating a state of deterioration estimator $SOHE_{bary}$ of the battery calculated as follows:

$$SOHE_{bary} = \alpha_1 \cdot SOHE_{Model} + \alpha_2 \cdot SOHE_{Coulomb} + \alpha_3 \cdot SOHE_R,$$

with $\alpha_1$, $\alpha_2$ and $\alpha_3$ barycentric coefficients associated with the calculation of the state of deterioration, verifying $$\alpha_1 + \alpha_2 + \alpha_3 = 1$$

Instead of varying the weighting coefficients depending on time, the invention proposes to vary the coefficients $\alpha_1$, $\alpha_2$ and $\alpha_3$ on the basis of the level of deterioration $SOHE_{bary}$ estimated by the BMS at a previous time.

$SOHE_{model}$, $SOHE_{Coulomb}$ and $SOHE_R$ can be calculated by the methods described above applied directly to the battery as a whole, through the voltages across the battery and through the overall SOC of the battery. $SOHE_{model}$, $SOHE_{Coulomb}$, and $SOHE_R$ can be calculated respectively as the minimum value over the set of battery cells among the values $SOHE_{model}$, $SOHE_{Coulomb}$ and $SOHE_R$ calculated at a given time for each battery cell.

As mentioned above, the invention proposes choosing the coefficients $\alpha_1$, $\alpha_2$ and $\alpha_3$ in an optimized manner on the basis of the estimated state of deterioration of the battery.

In accordance with a particular embodiment of the invention, the coefficients $\alpha_1$, $\alpha_2$ and $\alpha_3$ may also depend on the use profile of the battery and/or of the vehicle in which the battery is installed. For example, once $SOHE_{bary}$ falls below a first threshold, it can reduce the weight $\alpha_1$ associated with the $SOHE_{model}$ calculation method and increase the weights $\alpha_2$ and $\alpha_3$. It is possible, in this second part of the battery life, to choose $\alpha_1 < \alpha_3$ (for example $\alpha_2 = 0$ and $\alpha_3 = 1$) if the last recorded discharge cycle or cycles has/have an amplitude greater than a discharge threshold (for example an amplitude of SOC greater than 0.7, and preferably greater than 0.8), and to choose $\alpha_2 > \alpha_3$ (for example $\alpha_2 = 1$ and $\alpha_3 = 0$) otherwise.

In accordance with an embodiment that can be combined with the previous embodiment, $SOHE_{bary}$ can be fixed to be consistently less than or equal to $SOHE_{model}$ calculated by an empirical model, by limiting it by the following formula:

$$SOHE_{bary} = \text{Min}[(\alpha_1 \cdot SOHE_{Model} + \alpha_2 \cdot SOHE_{Coulomb} + \alpha_3 \cdot SOHE_{DCR}), SOHE_{Model}],$$

Some examples of barycentric coefficient variation profiles are provided hereinafter.

It is sought for example to use predominantly $SOHE_{model}$ until the value $SOHE_{bary}$ reaches a value $SOHE_{threshold\_1}$, and then to predominantly use $SOHE_{coulomb}$, in early life, when $SOHE_{bary} > SOHE_{threshold\_1}$, $\alpha_1 = 1$.

When $SOHE_{bary} = SOHE_{threshold\_1}$ then $SOHE_{bary} < SOHE_{threshold\_1}$, $\alpha_1$ is decreased linearly (compared to $SOHE_{bary}$) from 1 to zero. For example, $\alpha_1$ can be decreased linearly from 1 to zero over the range $SOHE_{bary}$ between 0.9 and 0.8.

In accordance with another variant embodiment, the linear variation of $\alpha_1$ can be performed with respect to $SOHE_{model}$ itself, or even with respect to the mileage traveled by the vehicle in which the battery is installed, for $SOHE_{model} < 80\%$, $\alpha_1 = 0$.

The decrease of $\alpha_1$ can be compensated for by linearly increasing one of the other barycentric coefficients alone (for example $\alpha_2$ to then give the predominance to the coulomb calculation) or by increasing linearly simultaneously several other barycentric coefficients.

It is known by those skilled in the art that the estimation of the SOHE from the internal resistance of the battery is generally less accurate than the estimation of the SOHE by coulomb counting, assuming that this coulomb counting is performed over a deep discharge of the battery.

Thus, as long as the driver of a vehicle powered by a battery does not perform a deep discharge of the battery, the best way to estimate the state of deterioration of the battery in closed loop is to use the approach based on the internal resistance of the battery.

In accordance with a preferred embodiment, if the driver of the vehicle, before passing $SOHE_{threshold\_1}$, has only used the battery within limited SOC ranges (for example SOC remains consistently greater than or equal to 0.7), then it is chosen to compensate for the decrease of $\alpha_1$ by an increase of $\alpha_2$, that is to say it is set that $\alpha_2=1-\alpha_1$, and $\alpha_3=0$ until $\alpha_2$ becomes equal to 1.

However, if the driver of the vehicle, during a minimum number of cycles, fixes SOC variations greater than a threshold, for example greater than an SOC amplitude of 0.4, then it is chosen to compensate for the decrease of $\alpha_1$ by an increase of $\alpha_3$, that is to say it is set that $\alpha_3=1-\alpha_1$, and $\alpha_2=0$ until $\alpha_3$ becomes equal to 1.

In the specific case that $\alpha=1$, it is also possible, after having detected a minimum number of cycles with SOC variations greater than a threshold, for example greater than an SOC amplitude of 0.4, to decrease $\alpha_2$ linearly and to compensate for the decrease of $\alpha_2$ by an increase of $\alpha_3$, that is to say to set that $\alpha_3=1-\alpha_2$, and $\alpha_1=0$ until $\alpha_3$ becomes equal to 1.

Other specific cases are of course possible, for example compensating for a linear decrease of $\alpha_1$ by simultaneously increasing $\alpha_2$ and $\alpha_3$, for example $\alpha_2=\alpha_3$ and $\alpha_2=0.5-0.5\cdot\alpha_1$.

It is known that the higher the end-of-charging voltage of the battery, the quicker the battery deteriorates during cycling. After a few months or years, the state of deterioration of the battery degrades faster than if the battery were subjected to cycling within a reduced SOC range. Thus, there is a compromise to be managed by the management of the end-of-charging voltage between the energy which it is desired to have at the end of short-term recharging and durability of the battery.

In accordance with a variant of the invention, to improve the service life of the battery, the BMS fixes, at the beginning of the life cycle of the battery, a maximum voltage at the end of recharging that is less than the maximum voltage acceptable at the end of recharging. The BMS then increases this maximum voltage during the battery life cycle, the variation of the maximum voltage following a predefined curve based on calculated barycentric SOHE values. The progression for example may be linearly rising, between the commissioning of the battery and the moment at which the maximum end-of-charging voltage fixed by the BMS becomes equal to the maximum end-of-charging voltage recommended by the manufacturer of the battery, or becomes equal to an arbitrary maximum voltage fixed in advance. From that moment, the BMS can then still fix the same maximum end-of-charging voltage. The maximum end-of-charging voltage curve then has a plateau for SOHE values below a threshold (in the case where the high values of SOHE correspond to a new state of the battery). Other curve forms are of course possible, in which the rate of increase of the maximum end-of-charging voltage (expressed for example in relation to $-SOHE_{bary}$) decreases with increasing age of the battery.

The invention is not limited to the exemplary embodiments described and may be provided in many variations. For example, the concept can be carried out using a value characteristic of the state of deterioration of the battery, which value increases over time, for example by taking the ones' complement (or the 100% complement) of the SOHE values described above. The values of SOC, SOHE and SOHP can be counted between zero and 1, or multiplied at a constant arbitrary value, for example 100%. The estimation of the SOHE values in accordance with the different methods of calculation taken into account in the barycentric calculation can be calculated globally for the entire battery or preferably for each cell in order to take into consideration, as necessary, the premature deterioration of one or more cells in particular. The barycentric coefficients can be varied on the basis of the values assumed by one of the basic SOHE estimations other than the $SOHE_{model}$ estimation by onboard model, for example on the basis of a value $SOHE_{coulomb}$ obtained by a method of the coulomb counting type, or on the basis of a value $SOHE_R$ calculated by a method involving a calculation of the development of an impedance or internal resistance of the accumulator. In accordance with yet another embodiment, it is possible to vary the barycentric coefficients on the basis of the barycentric value itself calculated at a previous time. It is beneficial to vary these coefficients on the basis of $SOHE_{model}$, which has fewer random fluctuations than the other estimation methods. The passing of a threshold of SOHE in one direction (for example the passing below an SOHE threshold), preferably causes a change of barycentric coefficients, but does not cause a change of coefficients in the opposite direction in the case of subsequent fluctuations around this threshold.

The invention makes it possible to improve the accuracy and to reduce the estimation dispersions of values of the state of deterioration of a storage battery. This consistency in estimating the state of deterioration of the battery then makes it possible to provide a reliable and consistent management of the end-of-charging voltages of the battery in order to improve the service life of the battery, whilst ensuring that the driver of the vehicle, at the end of each recharge, has a mileage autonomy that progresses regularly and safely.

The invention claimed is:

1. A method for managing an electrochemical accumulator, comprising:
    determining an estimated value of a state of deterioration of the accumulator from a history of voltage values across the accumulator, a history of an intensity of current flowing through the accumulator, and a history of a temperature of the accumulator,
    wherein the estimated value is a barycentric value of the state of deterioration calculated as a barycenter of at least two values indicative of the state of deterioration of the accumulator associated with barycentric coefficients based on at least one age value of the accumulator, the at least two values including a first value indicative of the state of deterioration of the accumulator calculated by a first method and a second value indicative of the state of deterioration of the accumulator calculated by a second method different from the first method, and
    wherein from an initial commissioning state of the accumulator, barycentric coefficients are varied at least once to calculate a next barycentric value of the state of deterioration of the accumulator, when a previous value of the state of deterioration of the accumulator, calculated according to the first method, has passed a first threshold; and
    managing a recharging of the accumulator based on the estimated value, wherein the recharging of the accumulator, an end-of-charging voltage is fixed that is calculated based on the barycentric value of the state of deterioration of the accumulator, the end-of-charging voltage being gradually increased during use of the accumulator onboard a vehicle.

2. The method as claimed in claim 1, wherein the first value is calculated from a first sum of a first temperature and first state of charge coefficients characterizing successive states of the accumulator, first state of charge coefficients each being multiplied by the time spent in each state, and from a second sum of a second temperature and second state of charge coefficients characterizing successive states of the accumulator, second state of charge coefficients each being multiplied by the energy discharged by the accumulator in this state.

3. The method as claimed in claim 2, wherein the first barycentric coefficient associated with the first value indicative of the state of deterioration calculated by the first method is strictly greater than 0.5 at the time of commissioning of the accumulator and then decreases, and wherein the second barycentric coefficient associated with the second value indicative of the state of deterioration calculated by the second method is strictly less than 0.5 and then increases over time.

4. The method as claimed in claim 3, wherein the first barycentric coefficient associated with the first value indicative of the state of deterioration remains constant until the barycentric value of the state of deterioration of the accumulator passes a first threshold, then varies substantially linearly based on the barycentric value of the state of deterioration of the accumulator until the barycentric value of the state of deterioration of the accumulator passes a second threshold.

5. The method as claimed in claim 2, wherein the barycentric value of the state of deterioration of the accumulator is closer to the first value indicative of the state of deterioration until a first threshold is passed by the barycentric value of the state of deterioration of the accumulator, then the barycentric value of the state of deterioration of the accumulator gradually becomes closer to the second value indicative of the state of deterioration until a third threshold is passed by the barycentric value of the state of deterioration of the accumulator, then the barycentric value of the state of deterioration of the accumulator becomes gradually closer to a third value indicative of the state of deterioration until a fourth threshold is passed by the barycentric value of the state of deterioration of the accumulator.

6. The method as claimed in claim 5, wherein the second value indicative of the state of deterioration is calculated by a method of a coulomb counting type, and the third value indicative of the state of deterioration is calculated by a method involving a calculation of development of an impedance or of an internal resistance of the accumulator.

7. The method as claimed in claim 1, wherein the end-of-charging voltage is fixed so as to vary linearly with respect to the barycentric value of the state of deterioration of the accumulator between the commissioning of the accumulator and a fifth threshold value of the barycentric value of the state of deterioration of the accumulator, and is then held substantially constant during a subsequent use of the accumulator onboard the vehicle.

8. An electric power supply system for a motor vehicle, comprising:
   at least one electrochemical accumulator;
   a temperature sensor associated with the accumulator;
   a voltage sensor and a current intensity sensor to estimate, respectively, a voltage across the accumulator and an intensity of current passing through the accumulator; and
   a processing circuitry configured to
   estimate a level of charge of the accumulator over time by using values of the voltage and the intensity,
   calculate a barycentric value of a state of deterioration of the accumulator, including a barycenter of at least one first and one second value characterizing a state of deterioration of the accumulator, the first and second values associated with barycentric coefficients based on at least one age value of the accumulator are calculated by two different methods,
   wherein barycentric coefficients used to calculate the barycentric value of the state of deterioration of the accumulator at a given time are dependent on a previous value calculated according to a first method during assessment thereof at a previous time, and
   configured to increase, during a life cycle of the accumulator, an end-of-charging voltage defining a maximum voltage to which a recharging system is authorized to bring the accumulator, the end-of-charging voltage being fixed based on the calculated barycentric value of the state of deterioration of the accumulator.

* * * * *